(12) United States Patent
Lee et al.

(10) Patent No.: US 6,562,679 B2
(45) Date of Patent: May 13, 2003

(54) METHOD FOR FORMING A STORAGE NODE OF A CAPACITOR

(75) Inventors: Kee-jeung Lee, Seoul (KR);
Seoung-wook Lee, Icheon-shi (KR);
Seung-hyuk Lee, Suwon-shi (KR);
Chan-bae Kim, Suwon-shi (KR);
Wan-gie Lee, Seoul (KR)

(73) Assignee: Hynix Semiconductor, Inc., Gyunggi-do (KR)

( * ) Notice: Subject to any disclaimer, the term of this patent is extended or adjusted under 35 U.S.C. 154(b) by 0 days.

(21) Appl. No.: 09/934,660

(22) Filed: Aug. 22, 2001

(65) Prior Publication Data

US 2002/0106856 A1 Aug. 8, 2002

(30) Foreign Application Priority Data

Aug. 28, 2000 (KR) ........................................ 2000-50183

(51) Int. Cl.$^7$ ......................................... H01L 21/8242
(52) U.S. Cl. ...................................................... 438/253
(58) Field of Search ................................ 438/253, 396; 257/409

(56) References Cited

U.S. PATENT DOCUMENTS

| 5,677,557 | A | * | 10/1997 | Wuu et al. | .................. | 257/382 |
| 5,900,660 | A | | 5/1999 | Jost et al. | | |
| 6,060,351 | A | | 5/2000 | Parekh et al. | | |
| 6,384,444 | B2 | * | 5/2002 | Sakoh | .................. | 257/303 |
| 6,391,736 | B1 | * | 5/2002 | Uh et al. | .................. | 438/396 |

* cited by examiner

Primary Examiner—David Nelms
Assistant Examiner—Thao P Le
(74) Attorney, Agent, or Firm—Marshall, Gerstein & Borun

(57) ABSTRACT

A method for forming the storage node of a capacitor which simplifies its process, and improves the electrical characteristics of semiconductor products by forming the storage node of a capacitor with no stepped portion between cell regions and peripheral circuit regions necessary for memory storage of semiconductor products of the next generation to which a fine line width is applied, and, at the same time, forming a guard ring for dividing the cell regions and the peripheral circuit regions.

17 Claims, 5 Drawing Sheets

METHOD FOR FORMING A STORAGE NODE OF A CAPACITOR

BACKGROUND

1. Technical Field

A capacitor, and more particularly, a method for forming the storage node of a capacitor are disclosed. The disclosed method simplifies the fabrication process, and improves the electrical characteristics of the semiconductor product by forming the storage node of the capacitor with no stepped portion between cell regions and peripheral circuit regions necessary for memory storage of semiconductor products of the next generation to which a fine line width is applied, and, at the same time, forming a guard ring for dividing the cell regions and the peripheral circuit regions.

2. Description of the Related Art

Generally, a capacitor is the part storing a charge and supplying the charge necessary for the operation of a semiconductor device. As a semiconductor device is being highly integrated, the size of unit cells is being decreased, and the capacitance needed for the operation of the device is being increased little by little. The capacitance needed by devices of more than 64M DRAM is currently over 30 fF per cell.

In a conventional process of forming the storage node of a capacitor, a polysilicon plug is formed by forming a contact for a storage node, depositing a polysilicon layer, and performing an etchback process. Then, a capacitor oxide film etching is performed by depositing a nitride layer as an etching barrier film, and depositing a PSG oxide film of a high wet etching speed, for thereby fabricating a capacitor of an inner or outer cylinder shape.

At this time, the etching barrier film acts as a dry etching barrier in the dry etching of the capacitor oxide film, and acts as a wet etching barrier in the wet etching of the capacitor oxide film. Thus, in case of increasing the size thereof, from the point of view of obtaining an etching selectivity, a cracking problem results due to a stress on a wafer.

If a thinner nitride film is used in order to avoid cracking, the nitride film gets attacked because of deficiency in a selection ratio in the dry etching of the capacitor oxide film, and even an inter-layer insulating film (ILD2) at lower portions is etched in the subsequent etching of the nitride film to thus become a leakage source, thereby causing the refresh characteristics of the capacitor to be degraded.

And, after etching the capacitor oxide film, a polysilicon layer, a storage node, is deposited, and then a capacitor dielectric film is deposited. Then, a PSG film or SOG film with a high wet etching speed is deposited on the front surface of the wafer, or a photoresist film is coated thereon, for thereby burying the inside of the structure of the inner cylinder.

Next, the polysilicon deposited in the cell and peripheral circuit regions is polished, and the PSG, the capacitor oxide film, is wet etched, for thereby forming a storage node module of the inner cylinder type.

However, in case of using this method, the capacitor oxide film in the peripheral circuit region as well as the capacitor oxide film in the memory cell region is removed in the wet etching process. Thus, a stepped portion as high as the storage node is generated between cells and peripheral circuits. In an exposure process, since there is no DOF (depth of Focus) margin, an inter-layer insulating film is formed, and then a chemical mechanical polishing process (CMP), is required. In order to enhance CMP uniformity, a cell recess masking process for partially etching only the insulating film in the cell region and etching processes are additionally required. Hence, the number of unit processes is increased, and the processes become complicated, for thereby increasing production costs.

SUMMARY OF THE DISCLOSURE

A method for forming a storage node of a capacitor which simplifies the fabrication process, and improves the electrical characteristics of semiconductor products by forming the storage node of a capacitor with no stepped portion between cell regions and peripheral circuit regions necessary for memory storage of next generation semiconductor products to which a fine line width is applied, and, at the same time, forming a guard ring for dividing the cell regions and the peripheral circuit regions.

To achieve the above advantages a method for forming the storage node of a capacitor according to a first embodiment includes: forming a gate having a bit line and a spacer on a semiconductor substrate; depositing an inter-layer insulating film and a barrier nitride film on the resultant material; forming a contact hole by depositing a contact mask on the inter-layer insulating film and the barrier nitride film and etching films, and then forming a polysilicon plug by depositing doped polysilicon in the contact hole and planarizing the same by a polishing process; depositing a capacitor oxide film and a hard mask polysilicon film on the resultant material; forming an antireflection film on the hard mask polysilicon film to thereafter stacking a photoresist film thereon; forming a contact in cell regions and a guard ring for dividing cell regions and peripheral circuit regions by firstly etching the hard mask polysilicon film using the photoresist film as a mask and secondly etching the capacitor oxide film so that the polysilicon plug is exposed to the etched hard mask polysilicon film; forming a doped polysilicon layer and hemispherical grain protrusions in the contact and guard ring; stacking a buried layer on the resultant material to thereafter planarize the same by a CMP polishing process; stacking a photoresist film in the peripheral circuit regions in the resultant material to thereafter remove the buried layer buried in the polysilicon plug in the cell regions; and forming a storage node by removing the capacitor oxide film stacked in the cell regions and the buried layer in the grain protrusions by using the photoresist film as a mask.

The barrier nitride film is formed at a thickness ranging from about 200 to about 1500 Å by the LP-CVD method or the PE-CVD method.

When the barrier nitride film and the first and second inter-layer insulating films are dry etched, they are preferably over-etched to about 30% of the thickness thereof.

Upon forming a polysilicon plug in the contact hole, doped polysilicon having a phosphorus concentration of more than $4 \times 10^{20}$ atoms/sec is used by the LP-CVD method or the RTP method.

The capacitor oxide film is preferably formed by depositing a PE-TEOS film or a USG film at a thickness at which a capacitance of 25 fF/cell can be obtained.

The antireflection film is formed by stacking a non-organic or organic substance such as SiON at a thickness ranging from about 100 to about 1000 Å.

Upon etching the capacitor film, the barrier nitride film at its lower portion is used as an etching barrier, and is over-etched to about 10 to about 100% of the thickness thereof.

The guard ring is formed to have a width ranging from about 0.1 to about 0.5 µm, and the etching selectivity of the capacitor oxide film to the barrier nitride film ranges from about 5:1 to about 20:1.

The grain protrusions of the storage node are thermal doped or plasma doped under a phosphorus gaseous atmosphere.

The thickness of the storage node is formed less than about 1000 Å to prevent shorting in a cylindrical cylinder.

The buried layer is stacked at a thickness ranging from about 0.1 to about 0.5 µm, and the photoresist film is stacked at a thickness ranging from about 0.1 to about 0.5 µm.

Upon performing the CMP polishing process after stacking the buried layer inside the polysilicon grain, the storage node and the hard mask polysilicon film are CMP polished from about 1 to about 20% of the thickness thereof.

Upon removing the capacitor oxide film by etching, it is over-etched from about 50 to about 500% of the thickness thereof by using the barrier nitride film as an etching barrier film.

In addition, there is provided a method for forming the storage node of a capacitor according to a second embodiment which includes: forming a gate having a bit line and a spacer on a semiconductor substrate; stacking a polysilicon layer on the resultant material to thereafter form a polysilicon plug by the CMP polishing process; depositing an inter-layer insulating film and a barrier nitride film on the resultant material; depositing a capacitor oxide film and a hard mask polysilicon film on the resultant material; forming an antireflection film on the hard mask polysilicon film to thereafter stack a photoresist film thereon; and opening the polysilicon plug by firstly etching the hard mask polysilicon film using the photoresist film as a mask and then etching the barrier nitride film and the inter-layer insulating film.

BRIEF DESCRIPTION OF THE DRAWINGS

The above objects, features and advantages of the disclosure will become more apparent from the following detailed description when taken in conjunction with the accompanying drawings, in which.

DETAILED DESCRIPTION OF THE PRESENTLY PREFERRED EMBODIMENTS

A preferred embodiment of the disclosure will now be described with reference to the FIGS. 1–7.

Figure 1:
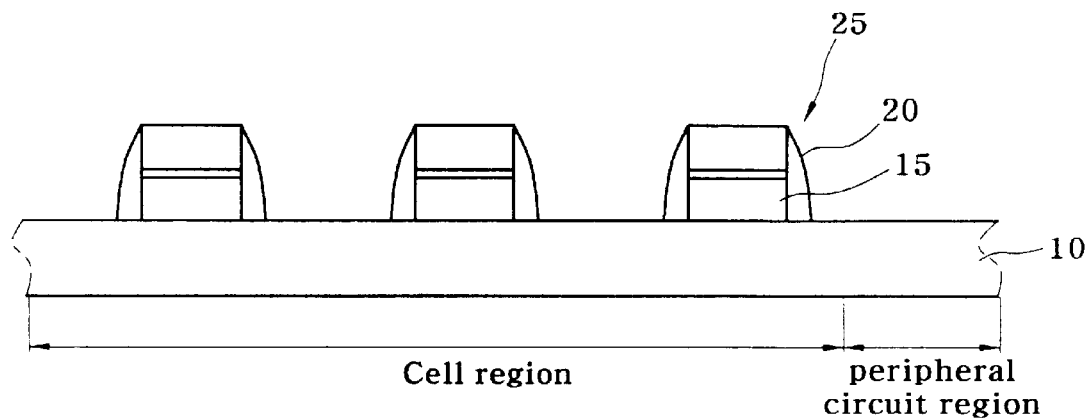
FIGS. 1 through 7 illustrate a method for forming the storage node of a capacitor according to a first embodiment of the disclosure.

As illustrated in FIG. 1, a gate 25 having a bit line 15 and a spacer 20 are formed in a cell region of a semiconductor substrate 10.

Figure 2:
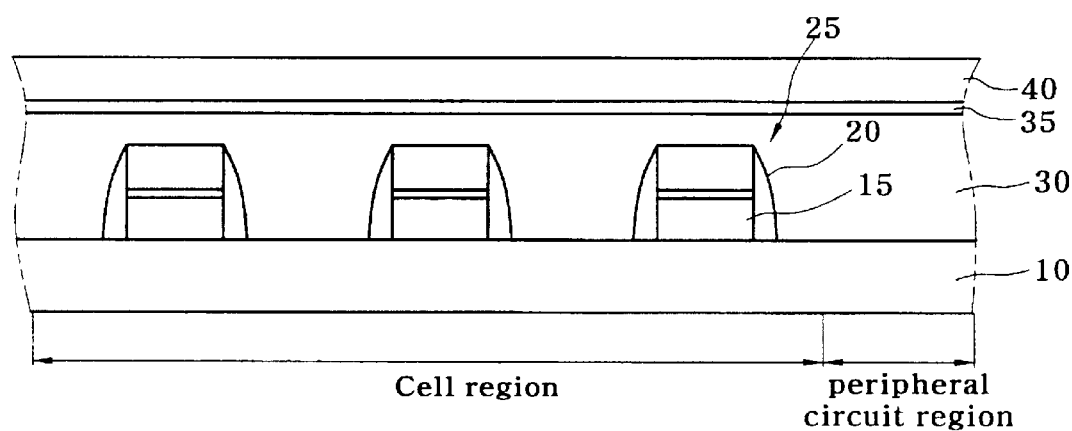

Then, as illustrated in FIG. 2, an inter-layer insulating films 30, 40 and a barrier nitride film 35 are formed on the resultant material.

The barrier nitride film 35 is formed at a thickness ranging from about 200 to about 1500 Å by the LP-CVD method and the PE-CVD method.

Figure 3:
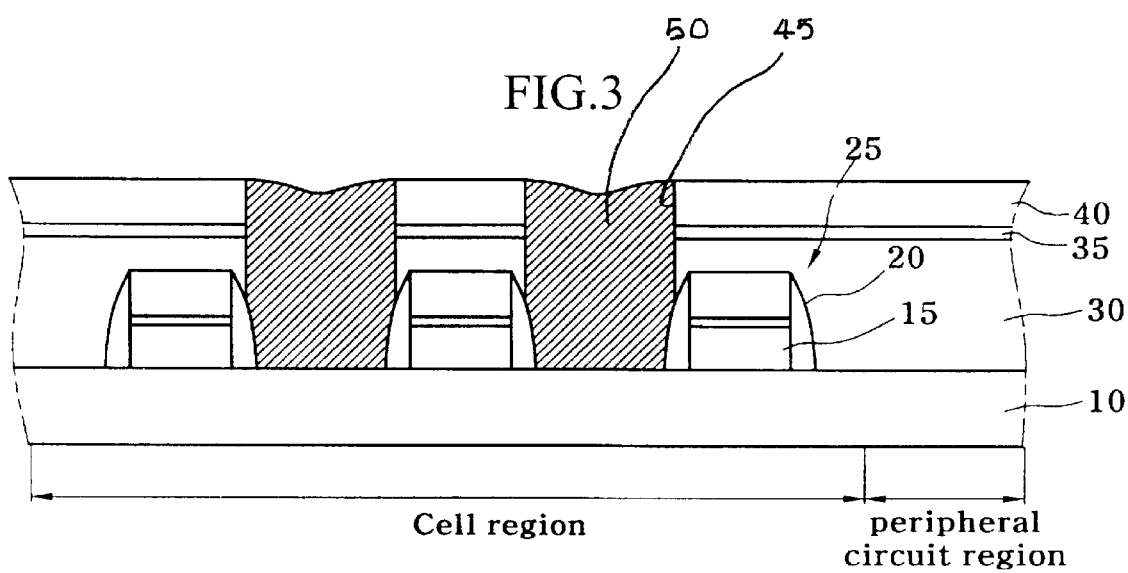

Then, as illustrated in FIG. 3, a contact hole 45 is formed on the resultant material by depositing a contact mask thereon and etching it. Thereafter, a polysilicon plug 50 is formed inside the contact hole 45 by depositing doped polysilicon therein and planarizing it by a polishing process.

When the barrier nitride film 35 and the first and second inter-layer insulating films 30 and 40 are dry etched, they are over-etched to about 30% of the thickness thereof.

Upon forming the polysilicon plug 50 in the contact hole 45, doped polysilicon having a phosphorus concentration of more than $4 \times 10^{20}$ atoms/sec is used by the LP-CVD method or the RTP method.

Figure 4:
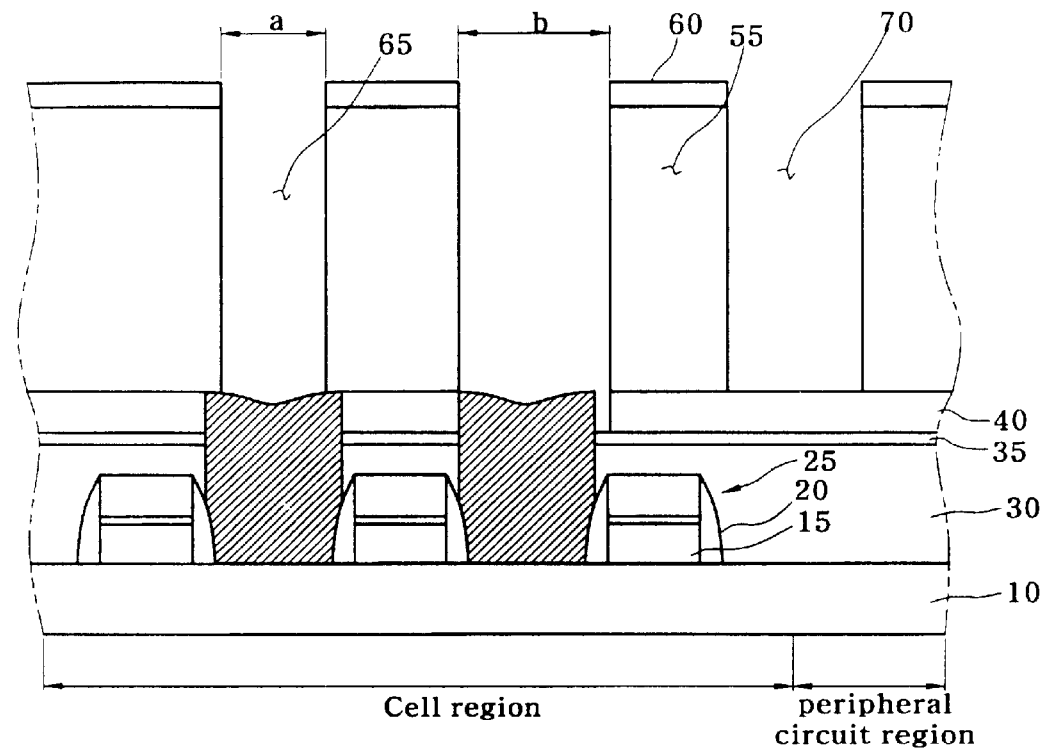

As illustrated in FIG. 4, a capacitor oxide film 55 and a hard mask polysilicon film 60 are formed on the resultant material.

Next, an antireflection film (not shown) is formed on the hard mask polysilicon film 60, and thereafter a photoresist film(not shown) is stacked thereon.

Then, a contact 65 is formed on the cell region, and at the same time a guard ring 70 for dividing cell regions and peripheral circuit regions is formed by firstly etching the hard mask polysilicon film 60 using the photoresist film as a mask, and secondly etching the capacitor oxide film 55 so that the polysilicon plug 50 is exposed by the etched hard mask polysilicon film 60.

At this time, the contact 65 in the cell region is formed as a minor axis cell (a) having a small width and a major axis cell (b) having a large width.

The capacitor oxide film 55 is formed by depositing a PE-TEOS film or a USG film at a thickness at which a capacitance of more than 25 fF/cell can be obtained.

The antireflection film is formed by stacking a non-organic or organic substance such as SiON at a thickness ranging from about 100 to about 1000 Å.

Upon etching the capacitor film 55, the barrier nitride film 35 at its lower portion is used as an etching barrier, and is over-etched to a range from about 10 to about 100% of the thickness thereof.

The guard ring 70 is formed to have a width ranging from about 0.1 to about 0.5 µm, and the etching selectivity of the capacitor oxide film 55 to the barrier nitride film 35 is with a range from about 5:1 to about 20:1.

Figure 5:
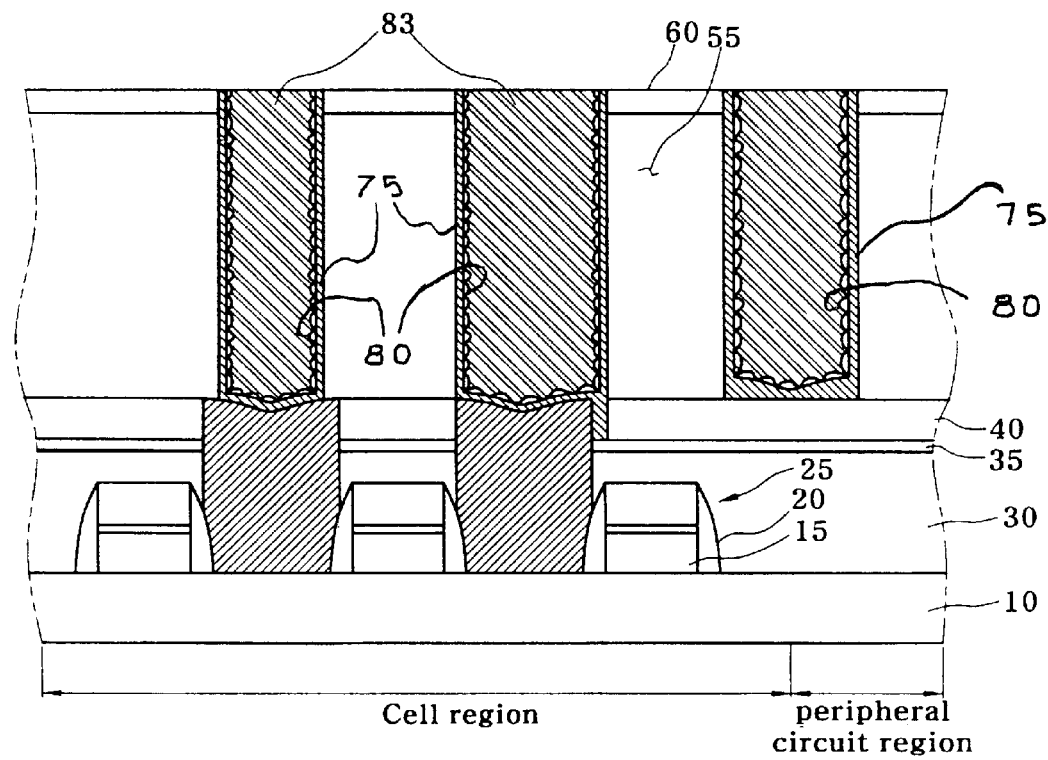
Figure 6:
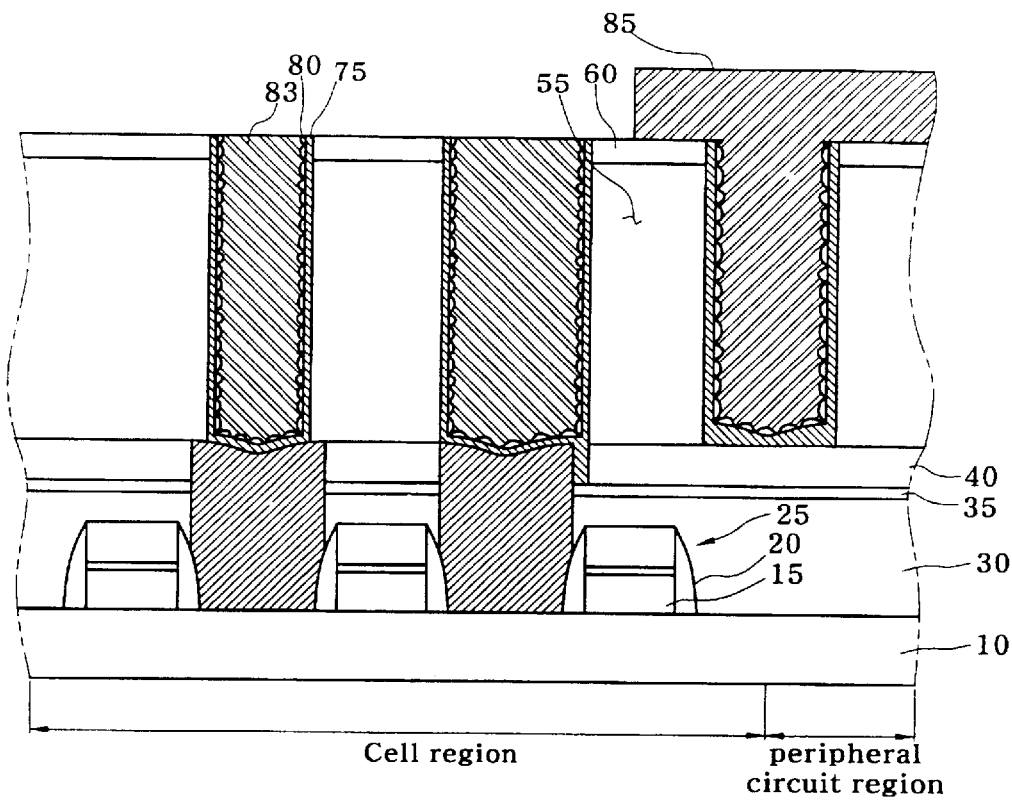
Figure 7:
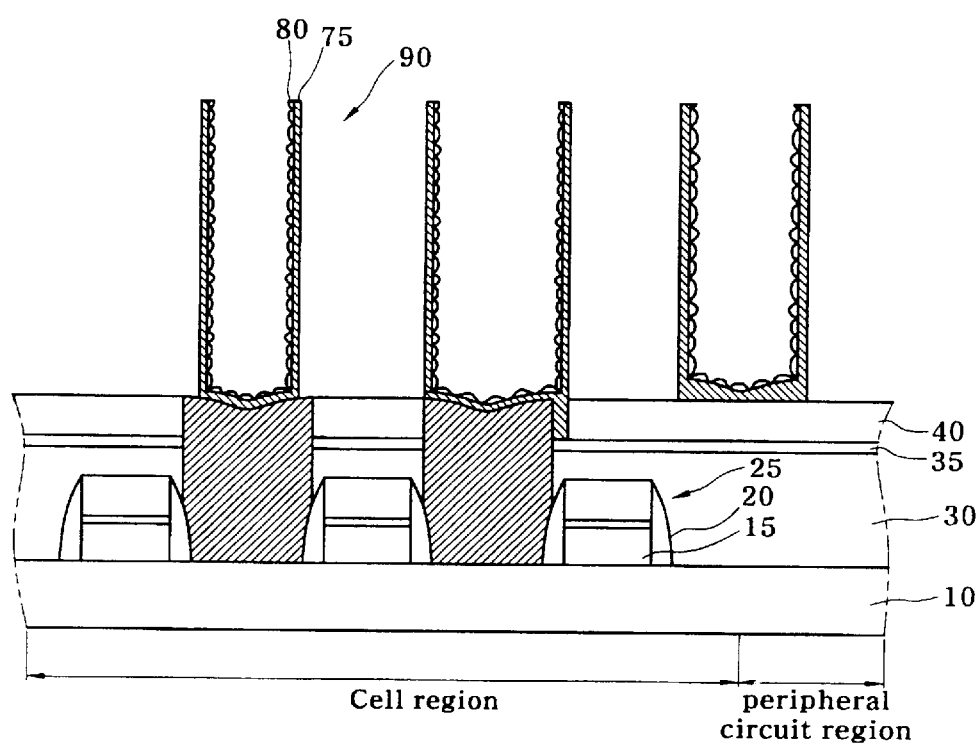

As illustrated in FIG. 5, a doped polysilicon layer 75 and hemispherical grain protrusions 80 are formed in the contact 65 and the guard ring 70. Then, as shown in FIGS. 5–7, a buried layer 83 is stacked on the resultant material, and then the resultant material is planarized by the CMP polishing process.

The grain protrusions 80 of the storage node 90 are thermally doped or plasma doped under a phosphorus gaseous atmosphere.

The thickness of the storage node 90 is formed less than about 1000 Å to prevent a short in a cylindrical cylinder.

The buried layer 83 is stacked at a thickness ranging from about 0.1 to about 0.5 µm, and the photoresist film 85 is stacked at a thickness ranging from about 0.1 to about 0.5 µm.

Upon performing the CMP polishing process after stacking the buried layer 83 inside the polysilicon grain protrusions 80, the storage node 90 and the hard mask polysilicon film 60 are CMP polished to a range from about 1 to about 20% of the thickness thereof.

As illustrated in FIG. 7, a storage node 90 is formed by removing the capacitor oxide film 55 stacked in the cell regions and the buried layer 83 in the grain protrusions by using the photoresist film 85 as a mask.

Figure 8:
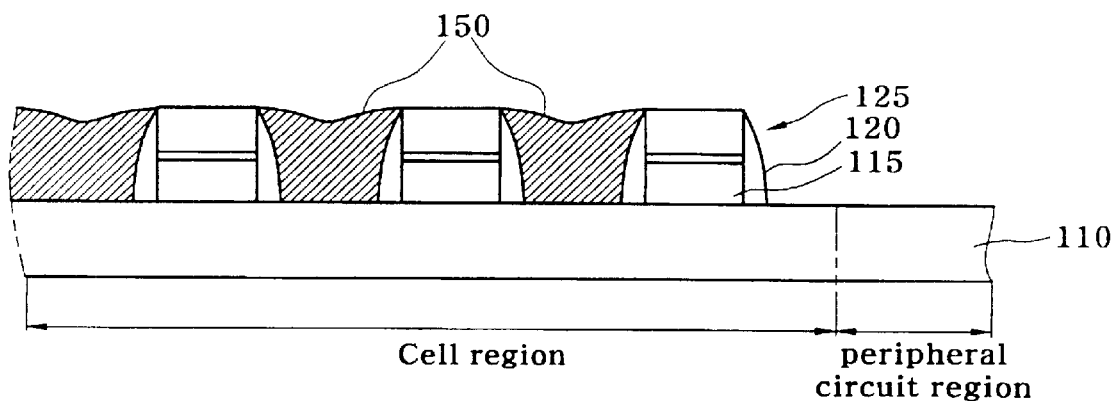
FIGS. 8 through 10 illustrate a method for forming the storage node of a capacitor according to a second embodiment of the disclosure.
Figure 9:
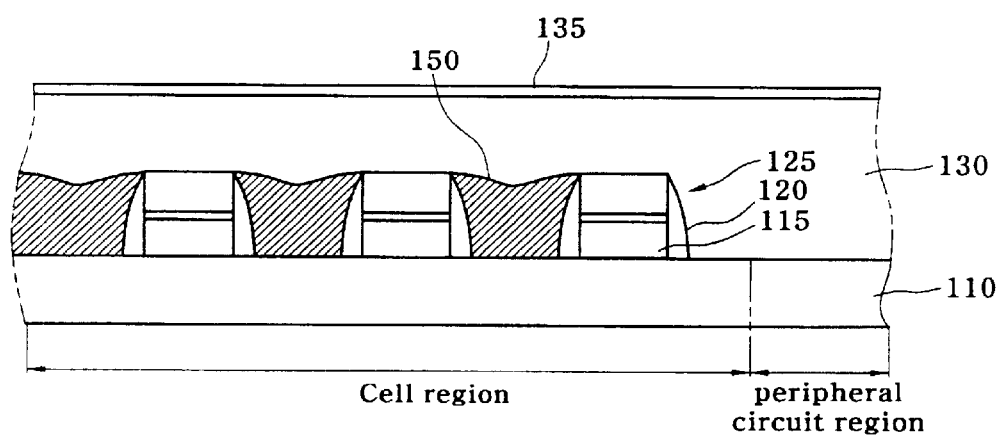
Figure 10:
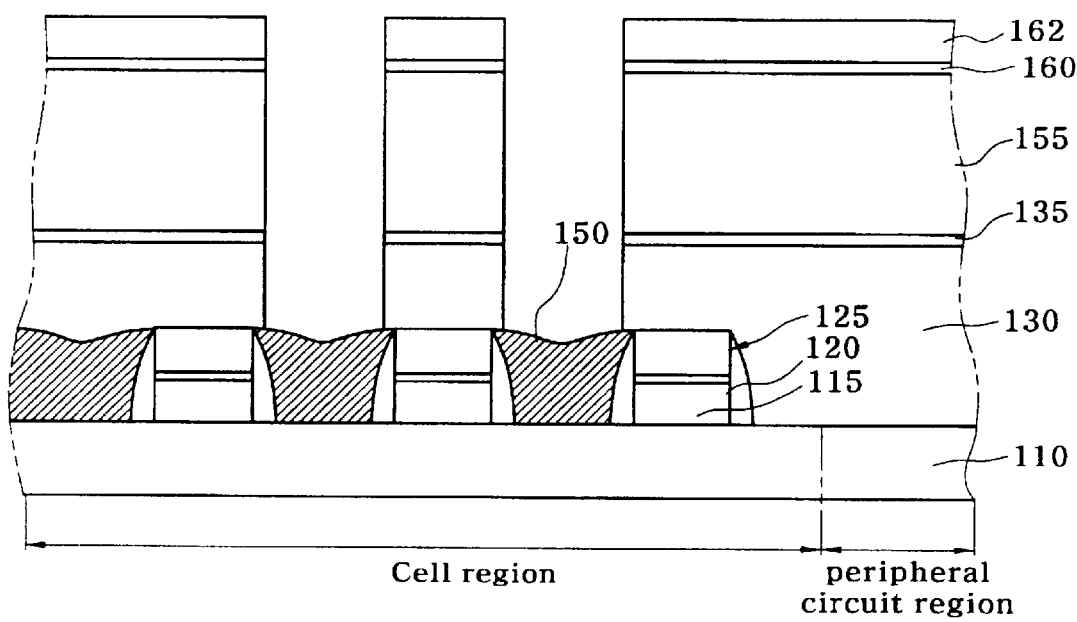

FIGS. 8 through 10 views illustrating a method for forming the storage node of a capacitor according to a second embodiment.

As illustrated in FIG. 8, a gate 125 having a bit line 115 and a spacer 120 is formed on a semiconductor substrate 110. Then, a polysilicon layer is stacked on the resultant material to thus form a polysilicon plug 150 thereon by the CMP polishing process.

As illustrated in FIG. 9, an inter-layer insulating film 130 and a barrier nitride film 135 are deposited on the resultant material.

The inter-layer insulating film 130 is stacked at a thickness of less than about 3000 Å, and the barrier nitride film 135 is formed at a thickness ranging from about 200 to about 1500 Å by the LP-CVD method or the PE-CVD method.

As illustrated in FIG. 10, a capacitor oxide film 155 and a hard mask polysilicon film 160 are stacked on the resultant material. Then, an antireflection film is formed on the hard mask polysilicon film 160, and then a photoresist film 162 is stacked thereon.

Then, the polysilicon plug 150 is opened by firstly etching the hard mask polysilicon film 160 and the capacitor oxide film 155 using the photoresist film 162 as a mask, and then etching the barrier nitride film 135 and the inter-layer insulating film 130.

Figure 11:
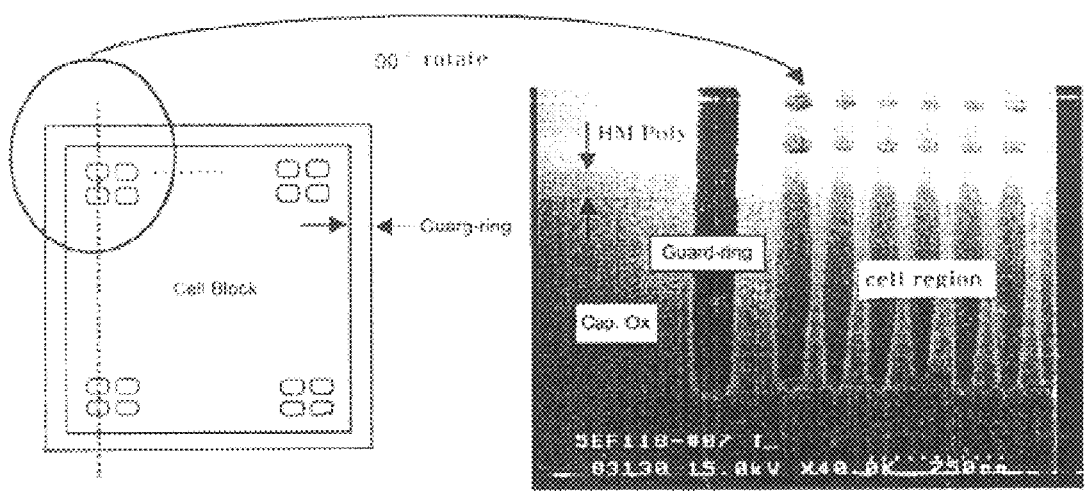
FIG. 11 is a schematic view and photograph illustrating the guard ring formation upon forming the capacitor according to the disclosure.

FIG. 11 illustrates, by way of a schematic drawing and a photograph, the guard ring and cell region of a capacitor made in accordance with the embodiments discussed above.

As described above, by using the method for forming the storage node of a capacitor according to the disclosure, its fabrication process is simplified and the electrical characteristics of semiconductor products are improved by forming the storage node of a capacitor with no stepped portion between cell regions and peripheral circuit regions necessary for memory storage of semiconductor products of the next generation to which a fine line width is applied, and, at the same time, forming a guard ring for dividing the cell regions and the peripheral circuit regions.

While the invention has been shown and described with reference to certain preferred embodiments thereof, it will be understood by those skilled in the art that various changes in form and details may be made therein without departing from the spirit and scope of the invention as defined by the appended claims.

What is claimed:

1. A method for forming the storage node of a capacitor, comprising:
    forming a gate having a bit line and a spacer in a cell region of on a semiconductor substrate, the semiconductor substrate also having a peripheral circuit region;
    depositing a first inter-layer insulating film, a barrier nitride film and a second inter-layer insulating film on the gate and the substrate;
    forming a contact hole by depositing a contact mask on the inter-layer insulating film and the barrier nitride film and etching them, and then forming a polysilicon plug by depositing a doped polysilicon in the contact hole and planarizing the same by a polishing process;
    depositing a capacitor oxide film and a hard mask polysilicon film on the resultant material;
    forming an antireflection film on the hard mask polysilicon film and thereafter stacking a photoresist film thereon;
    forming a contact in the cell region and a guard ring for dividing the cell region and the peripheral circuit region by firstly etching the hard mask polysilicon film using the photoresist film as a mask and secondly etching the capacitor oxide film so that the polysilicon plug is exposed to the etched hard mask polysilicon film;
    forming a doped polysilicon layer and hemispherical grain protrusions in the contact and guard ring;
    stacking a buried layer on the doped polysilicon layer and hemispherical grain protrusions in the contact and guard ring and thereafter planarizing the same with a CMP process;
    stacking a photoresist film on top of the doped polysilicon layer and hemispherical grain protrusions disposed in the guard ring in the peripheral circuit region and thereafter removing the buried layer buried disposed in the contact in the cell region; and
    forming a storage node by removing the capacitor oxide film stacked in the cell region and the buried layer and the grain protrusions by using the photoresist film as a mask.

2. The method according to claim 1, wherein the barrier nitride film is formed with a thickness ranging from about 200 to about 1500 Å by a LP-CVD method or a PE-CVD method.

3. The method according to claim 1, wherein, when the barrier nitride film and the first and second inter-layer insulating films are dry etched, they are over-etched at about 30% of the thickness thereof.

4. The method according to claim 1, wherein, upon forming a polysilicon plug in the contact hole, doped polysilicon having a phosphorus concentration of more than $4 \times 10^{20}$ atoms/sec is used by a LP-CVD method or a RTP method.

5. The method according to claim 1, wherein the capacitor oxide film is formed by depositing a PE-TEOS film or a USG film at a thickness at which a capacitance of 25 fF/cell can be obtained.

6. The method according to claim 1, wherein the antireflection film is formed by stacking a non-organic or an organic substance at a thickness ranging from about 100 to about 1000 Å.

7. The method according to claim 1, wherein, upon etching the capacitor film, the barrier nitride film at a lower portion thereof is used as an etching barrier, and is overetched from about 10 to about 100% of the thickness thereof.

8. The method according to claim 1, wherein the guard ring is formed to with a width to 0.1 to about 0.5 μm.

9. The method according to claim 1, wherein an etching selection ratio of the capacitor oxide film to the barrier nitride film ranges from about 5:1 to about 20:1.

10. The method according to claim 1, wherein the grain protrusions of the storage node is thermal doped or plasma doped under a phosphorus gaseous atmosphere.

11. The method according to claim 1, wherein the thickness of the storage node is formed less than about 1000 Å to prevent short in a cylindrical cylinder.

12. The method according to claim 1, wherein the buried layer is stacked at a thickness ranging from about 0.1 to about 0.5 μm, and the photoresist film is stacked at a thickness ranging from about 0.1 to about 0.5 μm.

13. The method according to claim 1, wherein, upon performing the CMP process after stacking the buried layer inside the polysilicon grain protrusions, the storage node and the hard mask polysilicon film are CMP polished at about 1 to about 20% of the thickness thereof.

14. The method according to claim 1, wherein, upon removing the capacitor oxide film by etching, it is overetched at about 50 to about 500% of the thickness thereof by using the barrier nitride film as an etching barrier film.

15. A method for forming the storage node of a capacitor, comprising the steps of:

forming a gate having a bit line and a spacer on a semiconductor substrate;

stacking a polysilicon layer on the gate and substrate thereafter forming a polysilicon plug adjacent the gate by a CMP process;

depositing an inter-layer insulating film and a barrier nitride film on the gate and plug;

depositing a capacitor oxide film and a hard mask polysilicon film on the barrier nitride film;

forming an antireflection film on the hard mask polysilicon film to thereafter stack a photoresist film thereon; and opening the polysilicon plug by firstly etching the hard mask polysilicon film using the photoresist film as a mask and then etching the barrier nitride film and the inter-layer insulating film.

16. The method according to claim 15, wherein the inter-layer insulating film is stacked at a thickness of less than about 3000 Å.

17. The method according to claim 15, wherein the barrier nitride film is formed at a thickness ranging from about 200 to about 1500 Å by a LP-CVD method or a PE-CVD method.

* * * * *